US007482258B2

(12) United States Patent
Gebreselasie et al.

(10) Patent No.: US 7,482,258 B2
(45) Date of Patent: Jan. 27, 2009

(54) PRODUCT AND METHOD FOR INTEGRATION OF DEEP TRENCH MESH AND STRUCTURES UNDER A BOND PAD

(75) Inventors: Ephrem G. Gebreselasie, Shelburne, VT (US); William T. Motsiff, Essex Junction, VT (US); Wolfgang Sauter, Richmond, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 10/908,118

(22) Filed: Apr. 28, 2005

(65) Prior Publication Data

US 2006/0246682 A1 Nov. 2, 2006

(51) Int. Cl.
*H01L 21/44* (2006.01)
(52) U.S. Cl. .................. 438/612; 438/400; 257/E23.01
(58) Field of Classification Search .................. 438/612, 438/400; 257/E23.01
See application file for complete search history.

(56) References Cited

U.S. PATENT DOCUMENTS

| 5,838,023 | A | 11/1998 | Goel et al. |
| 5,901,022 | A | 5/1999 | Ker |
| 6,198,170 | B1 | 3/2001 | Zhao |
| 6,566,244 | B1 | 5/2003 | May et al. |
| 6,633,087 | B2 | 10/2003 | Ker et al. |
| 6,678,950 | B1 | 1/2004 | Allman et al. |
| 6,734,093 | B1 | 5/2004 | Sabin et al. |
| 2001/0051426 | A1 | 12/2001 | Pozder et al. |
| 2002/0187634 | A1 | 12/2002 | Saran et al. |
| 2002/0192919 | A1* | 12/2002 | Bothra ........................ 438/381 |
| 2003/0062588 | A1* | 4/2003 | Grivna ........................ 257/510 |
| 2005/0014356 | A1* | 1/2005 | Pozder et al. ............... 438/614 |

\* cited by examiner

*Primary Examiner*—Bradley K Smith
(74) *Attorney, Agent, or Firm*—Anthony J. Canale; Greenblum & Bernstein P.L.C.

(57) ABSTRACT

A method of integrating circuit components under bond pads includes establishing a trench border on a circuit element and synthesizing a set of trench mesh edges of a trench mesh to be coincident with the trench border on the circuit element. The method further includes eliminating a trench mesh contained within the trench border of the trench circuit element.

22 Claims, 4 Drawing Sheets

PRODUCT AND METHOD FOR INTEGRATION OF DEEP TRENCH MESH AND STRUCTURES UNDER A BOND PAD

FIELD OF THE INVENTION

The invention generally relates to the integration of circuit components under a bond pad and more particularly, integration of deep trench mesh, CMOS, bipolar, and bipolar-CMOS (BiCMOS) structures and/or radio frequency (RF) passive structures under a bond pad.

DESCRIPTION OF THE RELATED ART

Radio frequency (RF) applications exist consisting of CMOS, bipolar, and bipolar-CMOS (BiCMOS) technology. In RF technology, a large number of different devices can be constructed. In CMOS technology, MOSFET transistors, resistors and diodes are constructed. In bipolar technology, bipolar transistors are formed. In bipolar CMOS technology, both MOSFETS and bipolar elements are formed. In Silicon Germanium (SiGe) devices, germanium is introduced into the base layer of an otherwise all-silicon bipolar transistor which creates significant improvements in operating frequency, current, noise, and power capabilities. At the same time, the key advantages of a state-of-the-art, 200 mm silicon process are maintained, including high integration level and economy of scale.

These high-performance technologies include both active and passive elements. CMOS technology consists of primary MOSFETs. RF-CMOS contains both RF passive elements and MOSET elements. RF BiCMOS SiGe Heterostructure Bipolar Transistors (HBT) technology include multiple SiGe HBT devices, and include passive elements such as transmission lines, inductors, capacitors, and resistors. Both RF CMOS and RF BiCMOS SiGe structures have applications in wireless communications and data-conversion components. RF CMOS has applications for wired and wireless application space such as cell phones, Blue tooth, Wi-Fi and other wireless applications. RF BiCMOS SiGe technology have further applications with products such as inexpensive safety systems for automobiles, including radar for collision warning or advanced cruise control; wireless voice and data handsets, with both RF and digital subsystems on a single chip; high-speed A/D and D/A converters for data acquisition, direct-to-baseband radio receivers; and low-cost, portable Global Positioning Satellite (GPS) receivers.

However, conventionally these RF circuit component structures are not placed under bond wire pads for RF CMOS and RF BiCMOS SiGe. In particular, they are not placed under bond wire pads for two physical reasons. First, when you apply pressure to the bond wire onto the pads, you can change the device characteristics by the physical pressure that is applied to the device. Second, mechanical problems or stress can crack the insulators in the pad. In such a case it is possible to actually crack or what is called singe around the device itself. Such problems will impact the integrity of the product. Moreover a crack has the negative effect of allowing humidity to get into the strip and additionally can result in leakage problems or damaged devices.

SUMMARY OF INVENTION

One aspect of the invention is directed to a method of integrating circuit components under bond pads that includes establishing a trench border on a circuit element and synthesizing a set of trench mesh edges of a trench mesh to be coincident with the trench border on the circuit element. The method further includes eliminating a trench mesh contained within the trench border of the trench circuit element.

Another aspect of the invention is directed to a method of integrating circuit components under bond pads that includes forming a trench mesh in a substrate region and arranging at least one electrical device in the trench mesh. Moreover, the method includes forming a pad over the trench mesh and the at least one electrical device.

Another aspect of the invention is to place circuit elements under bond pad structures to prevent interaction between the structures under the bond pads with adjacent structures or circuit elements outside the bond pads. Moreover, the integration of the structures under the pads provides noise isolation, parasitic elements, and minimizes CMOS latchup.

In a further aspect of the invention, a structure includes a substrate and a trench structure within the substrate. A silicon germanium or silicon germanium carbon film is placed under an interlevel dielectric pad and between portions of the trench structure.

DETAILED DESCRIPTION

The invention is directed to integrating CMOS, bipolar, and silicon germanium active and passive elements under pond pads as well as other elements in a BiCMOS SiGe technology or BiCMOS Silicon Germanium Carbon (SiGeC) technology. The invention allows for increased density in both small and large chip designs in applications such as advanced CMOS or RF technologies. The structures of the invention are integrated with aluminum and copper interconnects in both the silicon dioxide ($SiO_2$) and "low-k" materials. The structures of the invention are integrated under normal pad structures as well as RF pads. The pads include meshes of deep trench structures to provide low capacitance pad structures.

Figure 1:
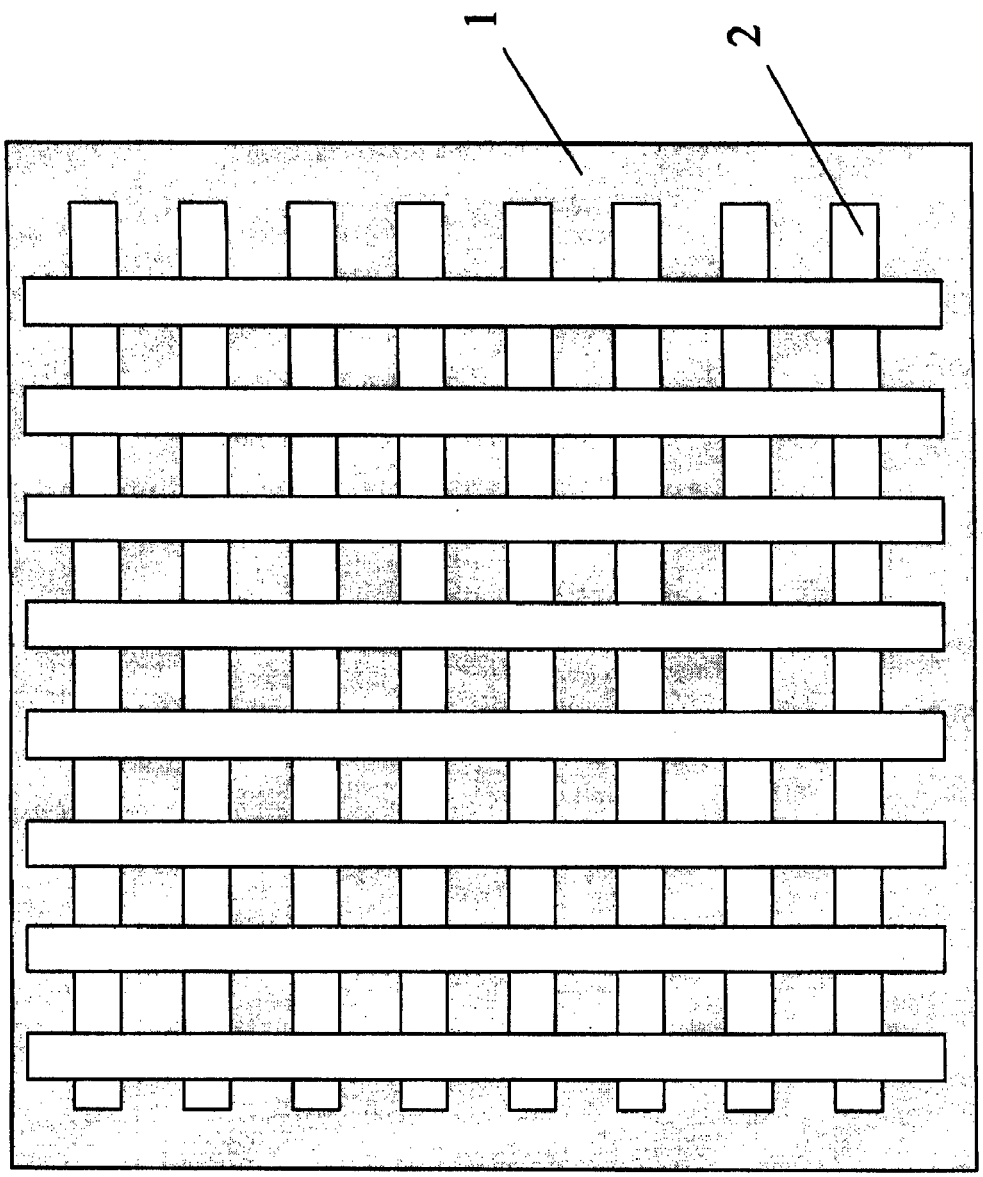
FIG. 1 is a schematic diagram showing a partial aspect of the invention that includes a deep trench mesh integrated under a bond pad.

FIG. 1 is a schematic diagram showing a partial aspect of the invention that includes a trench mesh 2 integrated under a bond pad 1. The trench mesh 2 is formed, by providing a trough, and filling with an insulator material. Between the trench-filled regions, is the substrate materials. The substrate materials can be intrinsic, epitaxial regions or doped with implanted regions. The trench structure can be a deep trench (DT) region. The deep trench (DT) can, in one aspect of the invention, extend 5 to 12 microns deep. For a trench isolation (TI), a medium depth trench can be formed which is typically 1 to 5 microns deep. In both the DT or TI structures, the trench sidewall can be an insulator region. In the case of the deep trench (DT) structure, it can have an insulator sidewall and filled with poly-silicon material. The purpose of the trench mesh is to reduce the capacitance of the bond pad for RF CMOS, RF Bipolar SiGe, RF BiCMOS SiGe, and RF BiCMOS SiGeC technology. Additionally, the trench mesh reduces the inductive coupling by reduction of the eddy currents (e.g. anti-current). The result of the mesh structure is that when currents are pulsed on the bond pad 1, little or no eddy-currents are established in a silicon portion that is adjacent to the bond pad 1. The effective distance between the bond pad and the silicon region is also further separated with the introduction of the insulator regions. This lowers the electrical capacitance and also reduces any eddy currents or magnetic inductive effects. Forming a trench mesh 2, such as a plurality of crisscross deep trench structures, also reduces the chances that a large current loop can be established, in order to eliminate any eddy currents for inductors or other devices.

Figure 2:
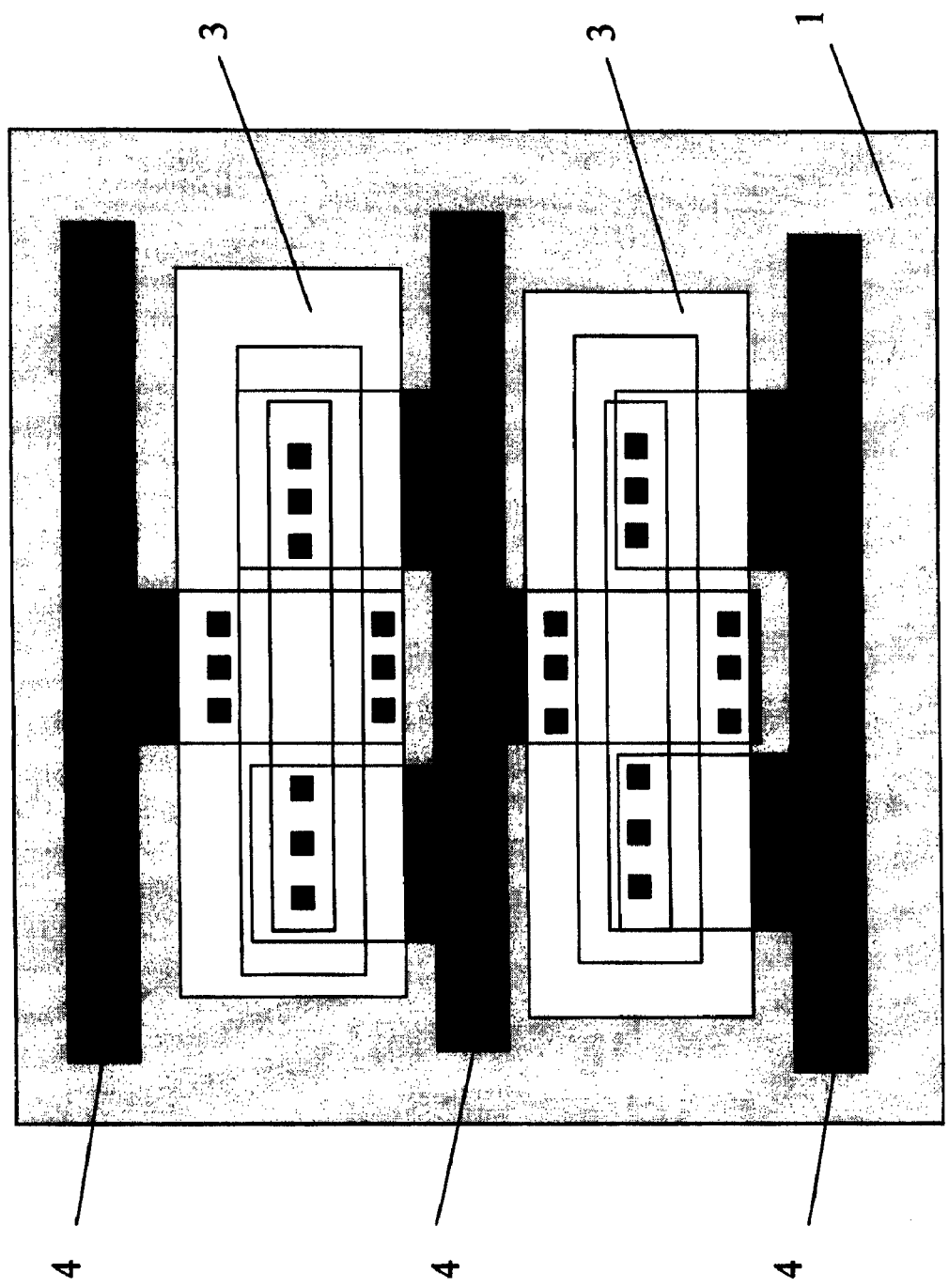
FIG. 2 is a schematic diagram illustrating a partial aspect of the invention having a plurality of circuit devices or electrical elements integrated under a bond pad.

FIG. 2 is a schematic diagram illustrating a partial aspect of the invention having a plurality of circuit devices or electrical elements 3 integrated under a bond pad 1. As shown in FIG. 2, each of the circuit devices or electrical elements 3 can be connected to voltage for substrate and sources (VSS) or a voltage drain drain (VDD) commonly shown as reference numeral 4. The circuit devices or electrical elements 3 can be any one of a CMOS device, or RF CMOS, RF Bipolar, or RF BiCMOS device; these can include MOSFETs, homojunction bipolar transistors, heterojunction bipolar transistors, resistors, capacitors, and inductor elements or MSCMOS (monotonic static complementary metal-oxide-semiconductor). For example, in a BiCMOS SiGe (or SiGeC) technology these can include high performance and high breakdown SiGe HBT devices, SiGe varactor, SiGe hyper-abrupt varactor, P+/nw diode, N-well diode, n+ diffusion diode, tantalum resistor, a MIM capacitor, or other known devices.

Figure 3:
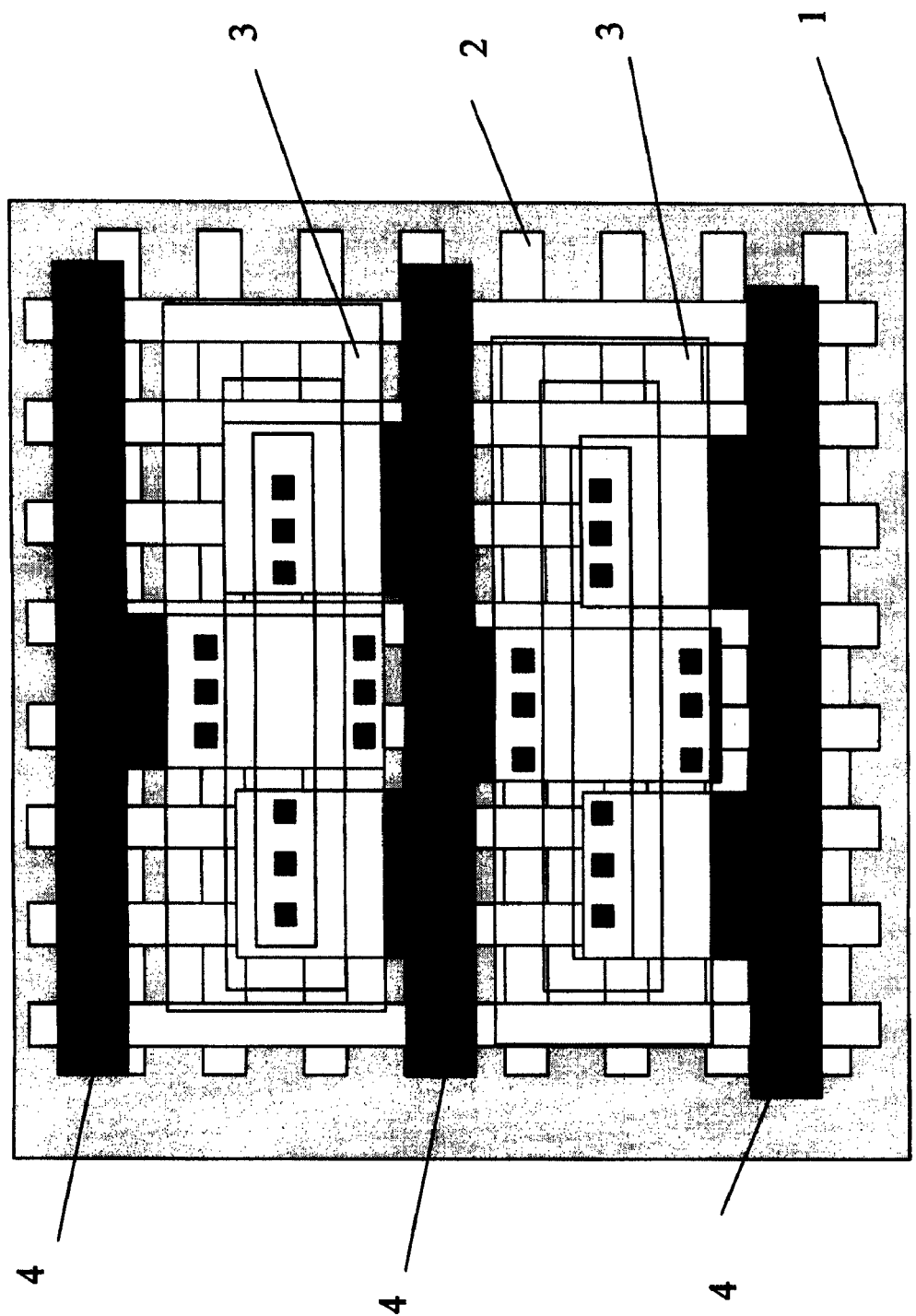
FIG. 3 is a schematic diagram illustrating an aspect of the invention having a plurality of circuit devices or electrical elements and deep trench mesh arranged under a bond pad.

FIG. 3 is a schematic diagram illustrating an aspect of the invention combining FIGS. 1 and 2, and having a plurality of circuit devices or electrical elements 3 and deep trench (DT) mesh 2 (or trench isolation (TI)) arranged under a bond pad 1. Again, each of the circuit devices or electrical elements 3 can be connected to the VSS or the VDD commonly shown as reference numeral 4. This arrangement of the circuit devices or electrical elements 3 and deep trench (DT) mesh 2 arranged under a bond pad 1, minimizes the area of open substrate and fills the regions between devices with the deep trench mesh to minimize capacitive coupling to the substrate. The structure of the invention also minimizes the noise coupling between adjacent elements under the pad as well as the noise coupling of the structure under pads to structures outside of the pads. In the latter scenario, the trench mesh minimizes any coupling effects. The structure of the invention also minimizes CMOS or BiCMOS latchup from adjacent structures under a pad by providing deep trench perimeter structures. CMOS latchup occurs in MOSFETs from parasitic pnp and npn elements formed by the MOSFETs, the substrate and the well regions; these form a parasitic pnpn structure. By placement of one of these elements away from the second (e.g. npn separated from the pnp) latchup can be minimized. Latchup can also occur between CMOS elements and the npn bipolar transistors. In Complimentary BiCMOS technology, a SiGe technology can contain both pnp SiGe HBT devices and npn SiGe HBT devices. Latchup can also occur in complimentary BiCMOS (C-BiCMOS) that contains both a npn and a pnp SiGe transistor forming a parasitic pnpn element.

In one implementation, the schematic of FIG. 3 (and FIG. 4) represents a structure having a substrate and a trench structure 2 within the substrate. The device 3 may be a silicon germanium or silicon germanium carbon film placed under the interlevel dielectric pad 1 and between portions of the trench structure. The silicon germanium or silicon germanium carbon film can be above or below the substrate surface. For instance, in a bipolar device, the silicon germanium or silicon germanium carbon film may be above the surface; whereas, in a strained silicon MOSFET, the silicon germanium or silicon germanium carbon film may be below or within the surface of the substrate.

Figure 4:
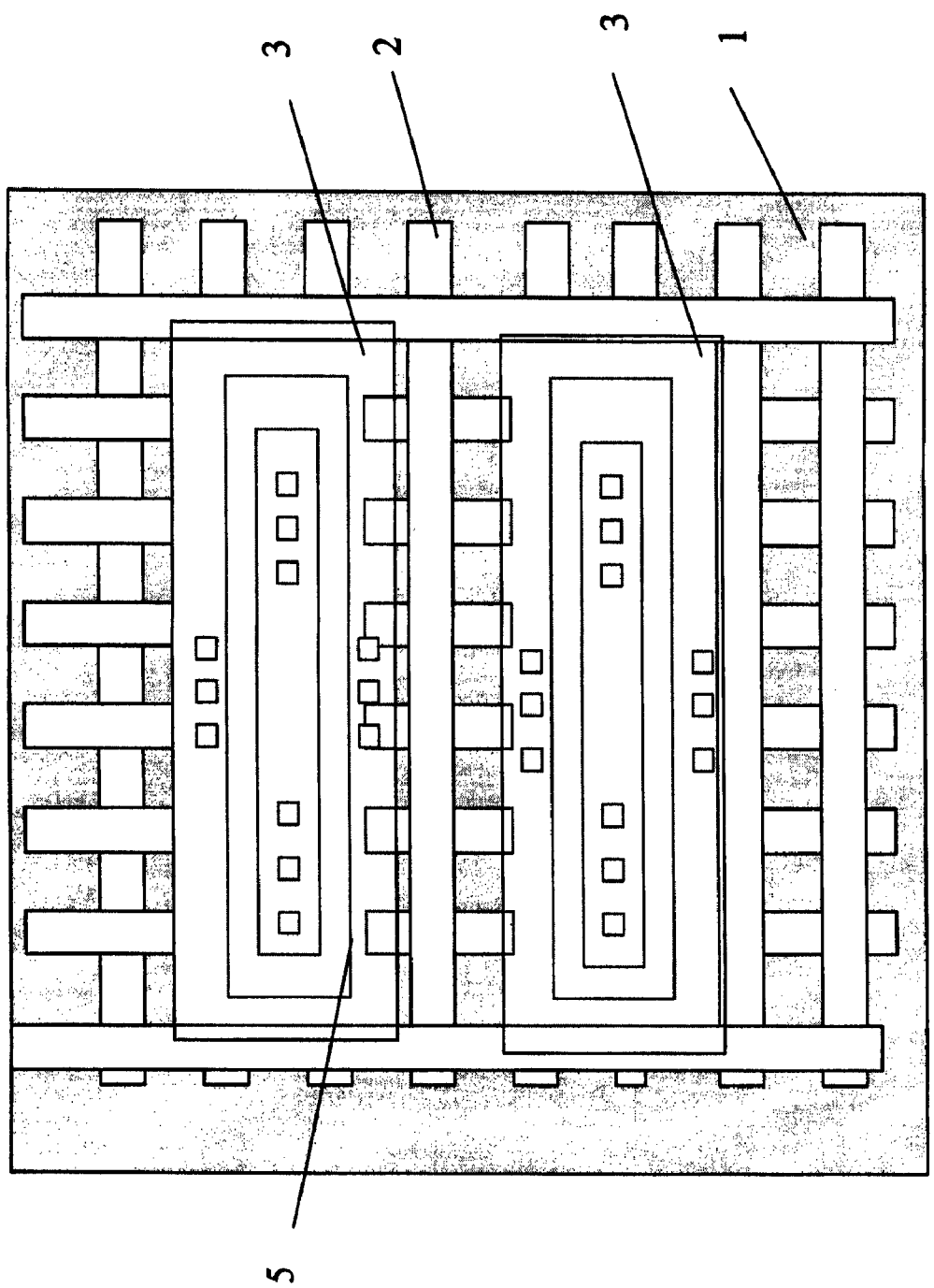
FIG. 4 is a schematic diagram illustrating an aspect of the invention having a plurality of circuit devices or electrical elements and deep trench mesh synthesized and integrated together under a bond pad.

FIG. 4 is a schematic diagram illustrating another aspect of the invention having a plurality of circuit devices or electrical elements 3 and deep trench mesh 2 synthesized together, and integrated under a bond pad 1. More specifically, the trench mesh 2 does not extend continuously over the pad 1 as with FIG. 3.

In this aspect of the invention, a trench border 5 is established on the circuit element 3. The deep trench mesh 2 then extends only to the trench border of the circuit element 3. Accordingly, trench mesh edges of the trench mesh 2 are synthesized or integrated to be coincident with the trench border 5 on the circuit element 3. In this regard, a trench shape of the trench mesh 2 contained within the trench border of the trench circuit element 3 is eliminated. In other words, the trench mesh 2 is not continuous, but has areas where the trench mesh 2 is not formed and the circuit devices or electrical elements 3 are formed. In this regard, the trench mesh 2 is formed such that there is portion that the trench mesh 2 is not present. In this portion that the trench mesh 2 is not present, a circuit element 3 can be formed with the trench mesh 2 located therearound. The resultant trench mesh 2 and the circuit devices or electrical elements 3 structures provide at least low capacitance pad structures.

With the above noted aspects of the invention, when currents are pulsed on the bond pad 1, little or no eddy currents (e.g. anti-currents) are established in a silicon portion that is under or adjacent to the bond pad 1. Moreover, the trench mesh 2 reduces the chances that a large current loop can be established. Furthermore, this arrangement minimizes the area of open substrate, capacitive coupling to the substrate, noise coupling, and latchup.

It should be apparent that although the trench mesh 2 is shown as a crisscross pattern, it would be within the scope and spirit of the invention to use any arrangement of trenches which lowers the capacitance, and also reduces any current or magnetic effects. Moreover, although specific reference is made to the deep trench for the trench mesh 2, other trench isolation structures such as shallow trench and trench isolation are also considered to be within the scope of the invention. Furthermore, the invention can further include doped or trench guard rings to provide improved substrate grounding of the devices 3. Additionally, deeper trenches are conceivable for use in DRAMS. Such trenches, in one aspect of the invention, would have a depth of approximately 12 microns.

The pad of the invention is simplistically shown in each of FIGS. 1-4. It should be apparent that any type of pad can used in conjunction with the invention. In particular, the pad can be a standard pad, a metal bond pad, a wire bond pad, or a RF octagonal pad. Moreover, although the invention uses the terminology on or over, the pad can be positioned anywhere with respect to the invention and should not be limited to any specific orientation. Moreover, the pad of the invention can be any pad allowing interaction with ESD, I/O, functional application in aluminum and/or copper interconnects, low-K, and SiO2 ILD devices.

It should also be apparent that the circuit devices or electrical elements 3 can be any particular devices or elements.

Specific reference is made to a limited number of devices merely for brevity. The invention can be used in conjunction with any CMOS, RF CMOS, RF BiCMOS silicon germanium, RF BiCMOS SiGeC structures and/or RF passive structures. Additionally, the circuit devices or electrical elements 3 can be arranged in any spatial orientation or arrangement. Moreover, the arrangement can be accomplished with an automated system known in the art. Additionally, it should be apparent that not every kind of device can be used as one of the circuit devices or electrical elements 3 positioned under trench mesh 2. In this regard, some devices have limited integrity and thus are not suitable for such an application.

Although the invention has been fully described above with reference to specific embodiments, other alternative embodiments will be apparent to those of ordinary skill in the art. Therefore, the above description should not be taken as limiting the scope of the present invention defined by the appended claims.

What is claimed is:

1. A method of integrating circuit components under bond pads, the method comprising:
    forming a trench mesh in a substrate region;
    arranging electrical devices in the trench mesh; and
    forming a bond pad over the trench mesh and the electrical devices,
    wherein an outer perimeter of the bond pad covers an area within which is arranged the electrical devices.

2. The method according to claim 1, further comprising integrating the trench mesh and the at least one electrical device.

3. The method according to claim 1, wherein the forming the trench comprises one of; forming a deep trench using CMOS, Bipolar or BiCMOS silicon germanium, or BiCMOS silicon germanium carbon technology.

4. The method according to claim 1, wherein the bond pad is one of a standard pad, a metal bond pad, a wire bond pad, and a RF octagonal pad.

5. The method according to claim 1, wherein each electrical device comprises at least one of a CMOS MOSFET, Silicon Bipolar, SiGe HBT device, SiGe varactor, SiGe hyper-abrupt varactor, P+/nw diode, N-well diode, n+diffusion diode, tantalum resistor, inductor and a MIM capacitor.

6. A semiconductor configured for radio frequency applications formed according to the method of claim 1.

7. The method according to claim 1, wherein the trench mesh fills regions between the electrical devices and wherein the trench mesh minimize capacitive coupling to the substrate.

8. The method according to claim 1, wherein the trench mesh reduces capacitance of the bond pad for RF technologies such as one of: RF CMOS, RF Bipolar SiGe, RF BiCMOS SiGe, and RF BiCMOS SiGe technology.

9. A method of integrating circuit components under bond pads, the method comprises:
    arranging a trench mesh under a bond pad;
    arranging an electrical element on an area of the trench mesh that is free of trench mesh and that is within a perimeter of the trench mesh; and
    arranging a trench border on the circuit element.

10. The method of claim 9, wherein the trench mesh is formed using one of:
    CMOS technology;
    bipolar MSCMOS technology;
    BiCMOS silicon germanium technology; and
    BiCMOS silicon germanium carbon technology.

11. The method of claim 9, wherein the bond pad is one of a standard pad, a metal bond pad, a wire bond pad, and a RF octagonal pad.

12. The method of claim 9, wherein the circuit element comprises at least one of:
    a CMOS MOSFET device;
    a Silicon Homojunction Bipolar Junction Transistor;
    an SiGe HBT device;
    an SiGe varactor;
    an SiGe hyper-abrupt varactor;
    a P+/nw diode;
    an N-well diode;
    an n+diffusion diode;
    a tantalum resistor;
    an inductor; and
    a MIM capacitor.

13. The method of claim 9, wherein the trench mesh extends only to the trench border arranged on the circuit element, whereby trench mesh edges of the trench mesh are coincident with the trench border.

14. The method of claim 9, wherein at least one of:
    the trench mesh reduces capacitance of the bond pad;
    the trench mesh minimizes capacitive coupling to a substrate; and
    when currents are pulsed on the bond pad, little or no eddy-currents are established in a silicon portion adjacent to the bond pad.

15. The method of claim 9, wherein the trench mesh is a deep trench perimeter structure.

16. The method of claim 9, wherein the trench mesh is located around the circuit element.

17. A semiconductor configured for radio frequency applications formed according to the method of claim 9.

18. The method of claim 9, wherein the electrical element comprises electrical devices and wherein the trench mesh fills regions between the electrical devices.

19. The method according to claim 9, wherein the trench mesh reduces capacitance of the bond pad for RF technologies such as one of: RF CMOS, RF Bipolar SiGe, RF BiCMOS SiGe, and RF BiCMOS SiGeC technology.

20. A method of integrating circuit components under bond pads, the method comprises:
    forming a non-continuous trench mesh under a bond pad;
    forming a circuit element on an area of the trench mesh that is free of trench mesh and that is within a perimeter of the trench mesh; and
    arranging a trench border on the circuit element.

21. The method of claim 20, wherein the circuit element comprises circuit devices and wherein the trench mesh fills regions between the circuit devices.

22. The method according to claim 20, wherein the trench mesh reduces capacitance of the bond pad for RF technologies such as one of: RF CMOS, RF Bipolar SiGe, RE BiCMOS SiGe, and RE BiCMOS SiGeC technology.

* * * * *